(12) United States Patent
Hillman et al.

(10) Patent No.: US 7,689,945 B2
(45) Date of Patent: Mar. 30, 2010

(54) PRODUCT RELIABILITY ANALYSIS

(75) Inventors: Craig Damon Hillman, Bethesda, MD (US); Nathan John Blattau, Waldorf, MD (US)

(73) Assignee: D&R Solutions, LLC, College Park, MD (US)

( * ) Notice: Subject to any disclaimer, the term of this patent is extended or adjusted under 35 U.S.C. 154(b) by 781 days.

(21) Appl. No.: 11/531,399

(22) Filed: Sep. 13, 2006

(65) Prior Publication Data
US 2007/0079190 A1    Apr. 5, 2007

Related U.S. Application Data

(60) Provisional application No. 60/717,030, filed on Sep. 15, 2005.

(51) Int. Cl.
*G06F 17/50* (2006.01)
(52) U.S. Cl. .............................................. 716/4; 716/5
(58) Field of Classification Search .................... 716/1, 716/4, 5; 714/724
See application file for complete search history.

(56) References Cited

U.S. PATENT DOCUMENTS

| | | | | |
|---|---|---|---|---|
| 5,414,351 A | * | 5/1995 | Hsu et al. | 324/756 |
| 5,539,652 A | * | 7/1996 | Tegethoff | 703/14 |
| 5,715,180 A | * | 2/1998 | Hu | 702/108 |
| 6,038,517 A | * | 3/2000 | Dobbins et al. | 702/82 |
| 6,594,799 B1 | * | 7/2003 | Robertson et al. | 716/1 |
| 2002/0030100 A1 | * | 3/2002 | Katayanagi et al. | 235/380 |
| 2002/0078403 A1 | * | 6/2002 | Gullo et al. | 714/37 |

OTHER PUBLICATIONS

Jennings,"Advanced Technology Component Derating", Feb. 1992, Rome Laboratory, Air Force Systems Command, Final Technical Report, one set.*

* cited by examiner

*Primary Examiner*—Sun J Lin
(74) *Attorney, Agent, or Firm*—Capitol City TechLaw; Richard C. Irving

(57) ABSTRACT

In one embodiment, a first set of inputs which describe aspects of a device may be received. A second set of inputs may be automatically provided for a group of assessments, included in an analysis, based on the first set of inputs and information in at least one database. An analysis may be performed based on the second set of inputs to assess the reliability of the device. A report may be generated based on the performed analysis.

18 Claims, 7 Drawing Sheets

PRODUCT RELIABILITY ANALYSIS

This application claims the benefit of provisional U.S. Patent Application No. 60/717,030, filed in the U.S. Patent and Trademark Office on Sep. 15, 2005, the content of which is incorporated by reference herein in its entirety.

BACKGROUND

Assessment tools exist for performing a reliability assessment with respect to mechanical, electrical, thermal and manufacturing aspects of an electronic or electrical product. Typically, the existing assessment tools were developed for use by large U.S. manufacturers who designed and manufactured their own products. Many of the existing tools are bundled with design software and are complex to use. For example, a person with knowledge and skill to use one of the above-mentioned tools may not have the knowledge and skill to use others of the existing tools. Further, many of the existing tools are time consuming to execute. For example, results of executing some of the existing tools may not be available for weeks.

Today, U.S. companies market and sell many products, however, the actual product design may be outsourced. If a company accepts a product design, which later is discovered to be defective, the company's reputation will suffer in the marketplace and the company's profitability will ultimately be adversely affected. Therefore, companies need to have a way to assess the reliability of product designs before manufacturing and selling products. Further, companies need to have a way to perform reliability assessment of product designs in a timely manner and without the need for personnel with specialized backgrounds to perform the reliability assessment.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In one aspect of an embodiment, a method may be provided for assessing reliability of a product. A first set of inputs which describe aspects of a device may be received. A second set of inputs may be automatically provided for a group of assessments included in an analysis, based on the first set of inputs and information in at least one database. An analysis may be performed based on the second set of inputs to assess the reliability of the device. A report may be generated based on the performed analysis.

In another aspect of an embodiment, a machine-readable medium which includes instructions for at least one processor may be provided. The machine-readable medium may include instructions for, automatically providing a second set of inputs for a plurality of assessments, included in an analysis, based on a first set of inputs and information in at least one database, instructions for performing the analysis based on the second set of inputs to assess reliability of a product and instructions for generating a report based on the performed analysis.

In yet another aspect of an embodiment, a system for assessing reliability of a product is provided. The system may include at least one processor, a memory, a storage device, including at least one database, and at least one communication interface connecting the at least one processor, the memory, and the storage device. The system may be configured to automatically provide a second set of inputs for a group of assessments, included in an analysis, based on a first set of inputs and information in the at least one database, perform the analysis to assess the reliability of the product, and generate a report based on the performed analysis.

DRAWINGS

In order to describe the manner in which the above-recited and other advantages and features can be obtained, a more particular description is described below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure.

Exemplary Processing System

Figure 1:
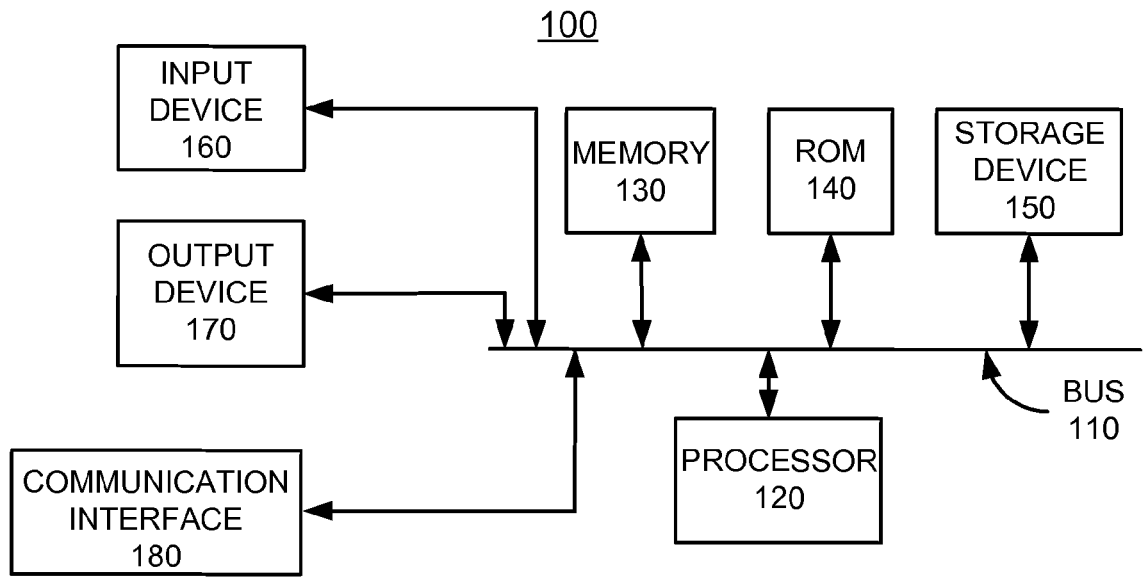
FIG. 1 illustrates an exemplary processing device which may be used to implement embodiments consistent with subject matter of this disclosure.

FIG. 1 illustrates a functional block diagram of an exemplary processing system 100, which may be used to implement embodiments consistent with the subject matter of this disclosure. Processing system 100 may include a bus 110, a processor 120, a memory 130, a read only memory (ROM) 140, a storage device 150, an input device 160, an output device 170, and a communication interface 180.

Bus 110 may permit communication among components of processing system 100. Processor 120 may include at least one conventional processor or microprocessor that interprets and executes instructions. Memory 130 may be a random access memory (RAM) or another type of dynamic storage device that stores information and instructions for execution by processor 120. Memory 130 may also store temporary variables or other intermediate information used during execution of instructions by processor 120. ROM 140 may include a conventional ROM device or another type of static storage device that stores static information and instructions for processor 120. Storage device 150 may include any type of media, such as, for example, flash memory, Non-Volatile Random Access Memory (NVRAM), magnetic or optical recording media and its corresponding drive or port.

Input device 160 may include one or more conventional mechanisms that permit a user to input information to processing system 100, such as a keyboard, a mouse, a pen, a stylus, a voice recognition device, a microphone, a headset, etc. Output device 170 may include one or more conventional mechanisms that output information to the user, including a display, a printer, one or more speakers, a headset, etc. Communication interface 180 may include any transceiver-like mechanism that enables processing system 100 to communicate with other devices or networks. Communication interface 180 may communicate via a wireless, wired or optical interface.

Processing system 100 may perform such functions in response to processor 120 executing sequences of instructions contained in a computer-readable medium, such as, for example, memory 130, a magnetic disk, an optical disk, or other medium. Such instructions may be read into memory 130 from another computer-readable medium, such as storage device 150, or from a separate device via communication interface 180.

Exemplary Operating Environment

Figure 2:
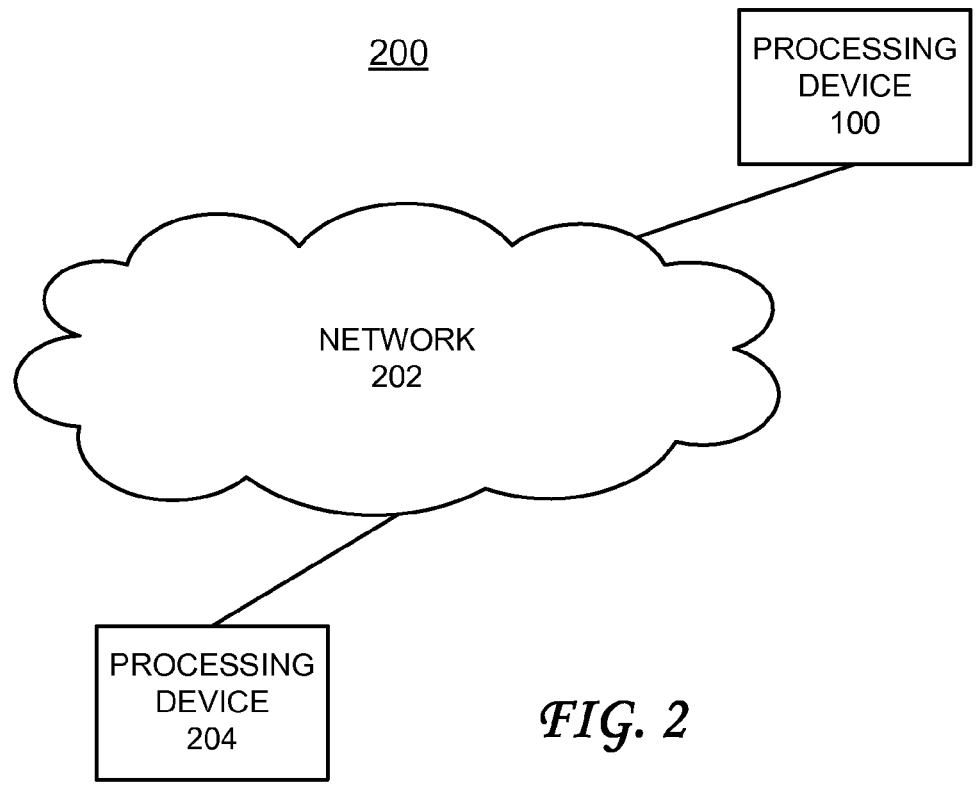
FIG. 2 illustrates an exemplary operating environment of embodiments consistent with the subject mater of this disclosure.

FIG. 2 illustrates an exemplary operating environment 200 for an embodiment consistent with the subject matter of this disclosure. Operating environment 200 may include processing system 100, a processing system 204 and a network 202.

Processing system 100 may include one or more processing systems, such as shown in FIG. 1. Processing system 100 may be a single device connected to a network, such as network 202, or may be a group of processing systems that communicate via one or more networks, in an embodiment in which processing is distributed among a number of processing systems 100.

Processing system 204 may be a user's processing system. Components of processing system 204 may be equivalent to those of processing system 100, shown in FIG. 1

Network 202 may be a wired or wireless network and may include a number of processing systems connected via wired or wireless means. Network 202 may include only one network or a number of different networks, some of which may be networks of different types. Network 202 may include, for example, a Local Area Network (LAN), a Wide Area Network (WAN), a packet switching network, an ATM network, an Ethernet network, a fiber-optic network, a Public Switched Telephone Network (PSTN), the Internet, or other types of network.

Operational Overview

The following is an overview of operation of various embodiments consistent with the subject matter of the disclosure. A detailed description of the operation of various embodiments is provided later.

In one embodiment, a user or processing device system 204 may access processing system 100 via network 202. For example, the user may access processing system 100 from processing system 204 by executing an application on processing system 204, which may access processing system 100 via network 202 and communication interface 180. That is, the user may provide inputs via input device 160 of processing system 204 and may be presented with outputs via output device 170 of processing system 204. Processing system 204 may provide inputs to processing system 100 via network 202 and communication interface 180 and may receive outputs from processing system 100 via network 202 and communication interface 180.

In another embodiment, processing system 100 may be a stand-alone embodiment. In the stand-alone embodiment, a user may directly communicate with processing system 100 via input device 160 and output device 170. In the stand-alone embodiment, network 202 may be unnecessary.

During operation, the user may provide input to processing system 100. The input may include, for example, information with respect to a number of devices of circuit boards and data files, which may include data related to thermal, mechanical, or electrical aspects of devices included in a product to be assessed. With respect to this disclosure, a device may be defined as a component or part included in a product. In various embodiments, a user may be prompted to review an interpretation of the provided inputs and may be prompted to provide additional information. In some embodiments, the user may view a two-dimensional rendering of aspects of the product to be assessed based on the input provided by the user. Further, the user may select at least one type of assessment to perform. In one embodiment, the types of assessment that may be performed include a thermal assessment, a vibration assessment, a time-to-failure assessment, and a part failure assessment. In other embodiments, different or other types of assessments may be performed. A report providing details of assessment results may be generated and provided to the user.

Exemplary Processing

Figure 3:
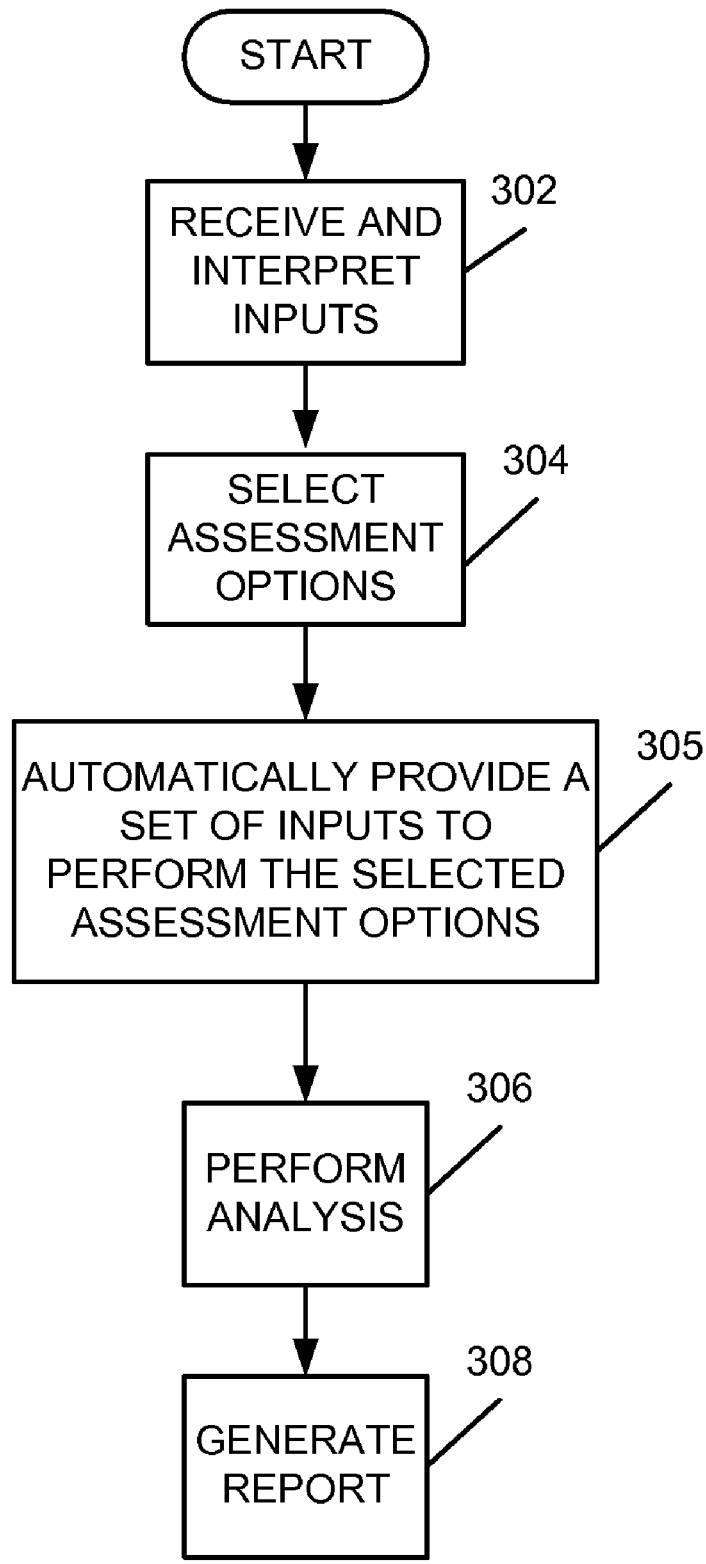
FIG. 3 is a flowchart which illustrates processing in an embodiment consistent with the subject mater of this disclosure.

FIG. 3 is a flowchart that illustrates exemplary processing that may be performed in an embodiment consistent with the subject matter of the disclosure. The process may begin with processing system 100 receiving inputs (act 302). The inputs may be provided directly to processing system 100 via input device 160, in a stand-alone implementation of processing system 100, or may be provided to processing system 100 via communication interface 180 and network 202 from another processing device, such as processing system 204 executing an application for providing input to processing system 100 and receiving output from processing system 100 via a network, such as, for example, network 202. In one embodiment, the inputs may include circuit board information, such as, for example, a number of circuit boards, board thickness, a number of layers, a thickness of copper layers, and board material. Other or different circuit board information may be provided in addition to, or instead of, the above-mentioned information. Further, the user may provide a number of different types of files as input, as will be discussed in more detail below.

Figure 4A:
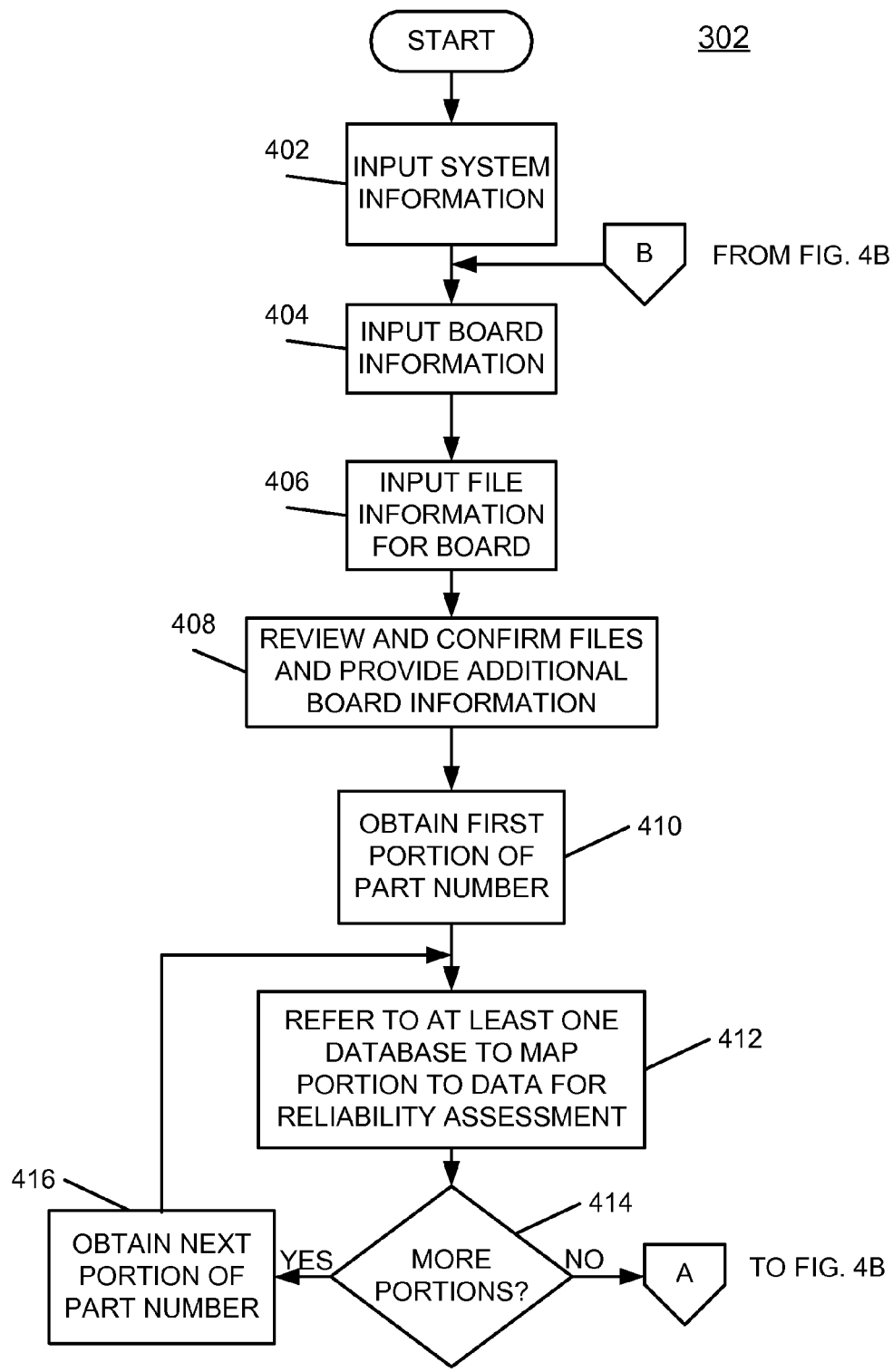
FIGS. 4A, 4B and 5 are flowcharts that provide more details of aspects of the flowchart illustrated in FIG. 3.

FIG. 4 illustrates act 302 in detail. First, the user may input system information, which describes the product to be analyzed (act 402). The system information may include, for example, a system name and a number of circuit card assemblies included in the product to be analyzed. The user may then be prompted to provide information for a board of the circuit card assemblies (act 404). The information that the user may provide may include board name and commentary. Commentary may include version number, design name, etc.

Next, the user may input information that describes a number of files, which may include data describing a board or circuit card assembly (CCA) (act 406). The information may include a filename for each of the files. The files may include board layout documentation (photoplots for the board manufacturing process), drill or plated thruhole files (for automatic drilling of vias, through-hole component mounting, and mechanical attachment points), component placement or XY files (for automatic component population), a net list, and a bill-of-materials (relating the component list to actual components). Other or different files may be provided in addition to, or instead of the above-mentioned files. The files may be input as individual files, compressed files, or may be exported from other assessment tools or applications.

The board layout documentation may be in a Gerber file format, or other format. The Gerber file format is a well-known file format for use by a photoplotter when creating a printed circuit board (PCB). When the board layout documentation files are in the Gerber file format, the file may conform to the RS274D Gerber format or the RS274X extended Gerber format. Other file formats may also be used for the board outline file and the copper area outline file.

The drill or plated thruhole file may include information describing plated thruholes that may appear in a circuit card or board. The plated thruhole file may be in a format, such as Excellon, or another useful format. The Excellon format is a well-known text-based file format used for controlling actions of a computer numerically controlled (CNC) drilling machine for drilling thruholes in PCBs.

The component placement or XY files may include information describing a location of components on a board or circuit card. The XY file may be in a number of different formats including, but not limited to a .XLS file (spreadsheet file), a CSV file (a tabular data format that includes fields separated by a comma and quoted by a double quote character), and a tab delimited format.

The bill-of-materials (BOM) file may include a listing of parts, sub-assemblies and raw materials included in the board or circuit card. The BOM file may be in a number of different formats, including, but not limited to a .XLS file, a .CSV file, and a tab delimited format.

The net list file may include a list of parts and their connection points which are connected in each net of a circuit or board. The net list file may be in a well-known format, such as IPC-D-356, or may be in another useful format. The IPC-D-356 format is a standard net list format for representing bare board test information.

Processing system 100 may prompt the user to review and confirm a collection of files of the currently selected CCA (act 408). For example, processing system 100 may cause a list of the files that have been uploaded to be displayed. Processing system 100 may permit the user to select one of these files, upon which processing system 100 may respond with a display of that file in some appropriate way. For example, processing system 100 may request the user to review the board layout information to confirm layer location, board outline, and copper outline. As an additional example, processing system 100 may cause the uploaded bill of materials to be displayed with an interpretation of each part included within the bill of materials. If the user disagrees with an interpretation of a part included within the bill of materials, the user may input a correct interpretation of the part Upon file confirmation, the user may be prompted to provide additional information for the board (act 408). The additional information that the user may provide may include board thickness, a number of layers, thickness of copper layers, dielectric material, and thickness of dielectric layers. The above provided information may be in millimeters or another convenient measurement unit.

Various manufacturers may have part numbering algorithms that provide additional information about parts. A BOM file may include manufacturers' part numbers for components of the device to be assessed. Part numbers may include alpha-numeric characters and symbols. Implementations of processing system 100 may use the manufacturer' part numbers and the part numbering algorithms to derive information about components described by the part numbers. In an exemplary embodiment of processing system 100, processing system 100 may obtain a first portion of a part number from, for example, a BOM file (act 410). The first portion of the part number may include one or more numbers and/or letters. Processing system 100 may refer to at least one database to map the first portion of the part number in order to derive data for analysis of the product (act 412). In one embodiment, processing system 100 may map the first portion of the part number to one or more of a material database, a package database (which may include, for example, geometric and mechanical properties of industry accepted and standard package styles), an electrical database (which may include circuit models, such as SPICE, for one or more integrated circuits), a thermal database (which may include JEDEC accepted thermal models for JEDEC standard package styles or other accepted thermal models), and a failure model database, which may include time-to-failure equations/algorithms/models, mean-time-to-failure equations/algorithms/models, physics-of-failure based equations/algorithms/models, and relevant constants and parameters specific to these equations/algorithms/models and the part/package/interconnect being modeled. Other embodiments may include additional or other databases. In one embodiment, processing system 100 may map respective portions of a part number to a case size, a Tagliabue Closed Cup (TCC) classification, capacitance, capacitance tolerance, termination type, DC voltage rating, marking, packaging information, operation sequence, or other information.

Next, processing system 100 may determine whether any additional portions of a part number are to be mapped (act 414). If additional portions of a part number are to be mapped, then processing system 100 may obtain a next portion of the part number (act 416) and may repeat acts 412 through 416. Processing system 100 may repeat acts 410-416 for each provided part number.

In some embodiments, processing system 100 may employ logic to recognize and predict part numbers if a provided part number is incorrect due to missing or incorrect alpha-numeric characters or symbols.

Figure 4B:
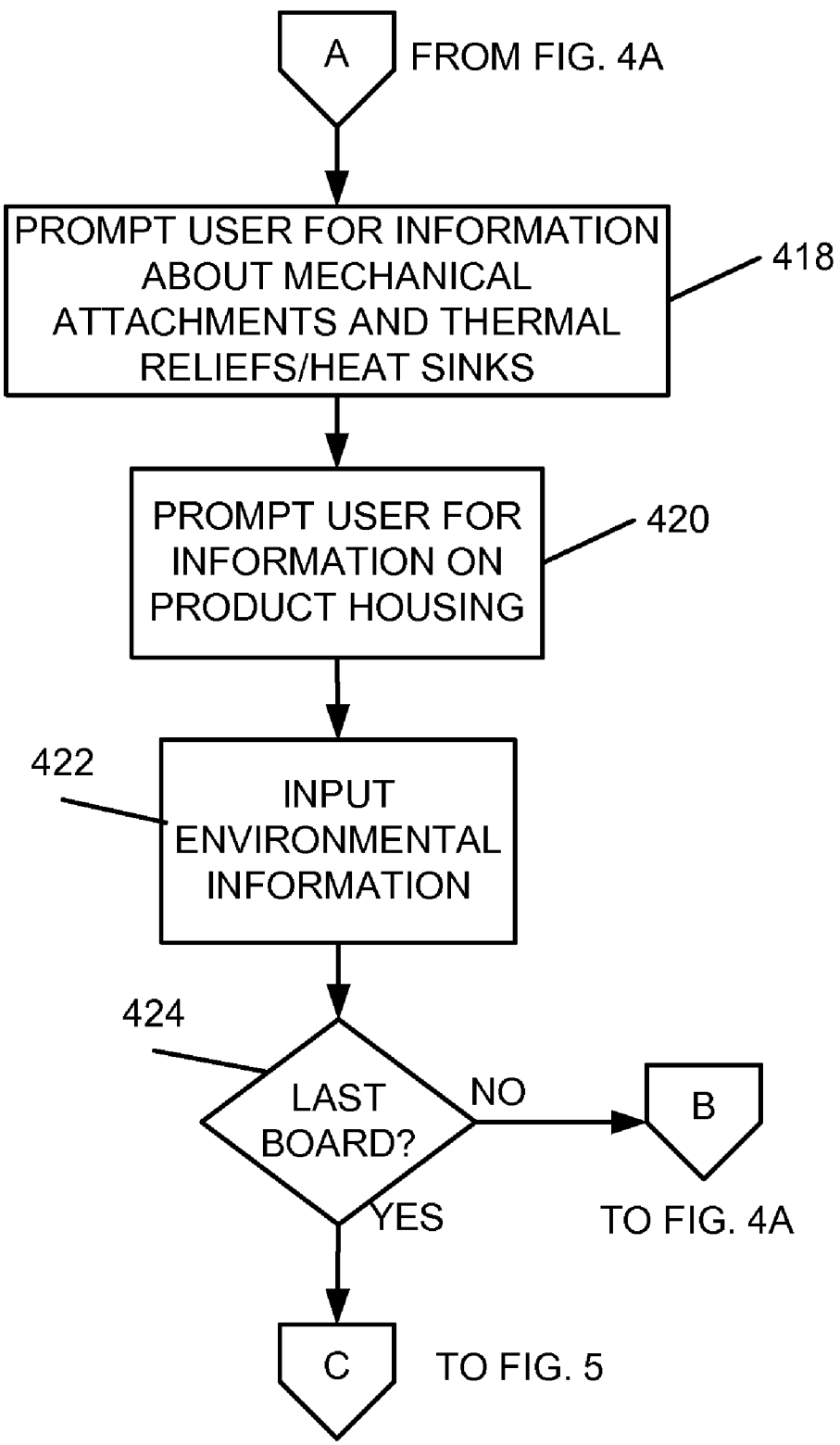

Processing system 100 may then prompt the user to provide information about mechanical attachments and thermal reliefs/heat sinks (FIG. 4B; act 418). For example, processing system 100 may cause a figure from the layout information to be displayed to the user. The figure may include information from the drill file and data obtained from the bill of materials. Processing system 100 may prompt the user to locate and identify mechanical attachments on the assembly. Examples of mechanical attachments may include press fit (tulip heads, etc.), standoffs (nylon, metal), and edge guide/card guide (snap fit included). Processing system 100 may further prompt the user to select the components with heat sinks and either describe the heat sink or select a predetermined configuration. A description may include material, dimensions, number fins, and geometry of fins.

Processing system 100 may then prompt the user to provide information about product housing (act 420). The information requested may include distance from assembly to housing, and whether the housing is vented or non-vented.

Processing system 100 may then prompt the user to provide information about a use environment (act 422). The information may include data with respect to an ambient environment (temperature, periodicity), adjacent heat sources (location, distance, temperature, periodicity), duty cycle, and mechanical loads (shipping/handling, vibration, mechanical shock).

After the above-mentioned files are uploaded for assessment of the device, processing system 100 may determine whether files for a last circuit card or board have been uploaded (act 424). If processing system 100 determines that files for one or more additional circuits cards or boards are to be uploaded, then acts 404 through 424 may be repeated by processing system 100.

Referring back to FIG. 3, processing system 100 may provide the user with an ability to select assessment options via processing system 100 or processing system 204 (FIG. 3; act 304). In one embodiment, processing system 100 may permit the user to select one or more assessment options from a group of assessment options that may include an electrical circuit assessment option, a thermal assessment option, a vibration assessment option, a time-to-failure for interconnects assessment option, a time-to-failure for parts assessment option, a component stress analysis, and a design rules (design for reliability (DfR) and manufacturability (DfM)) assessment option.

Figure 5:
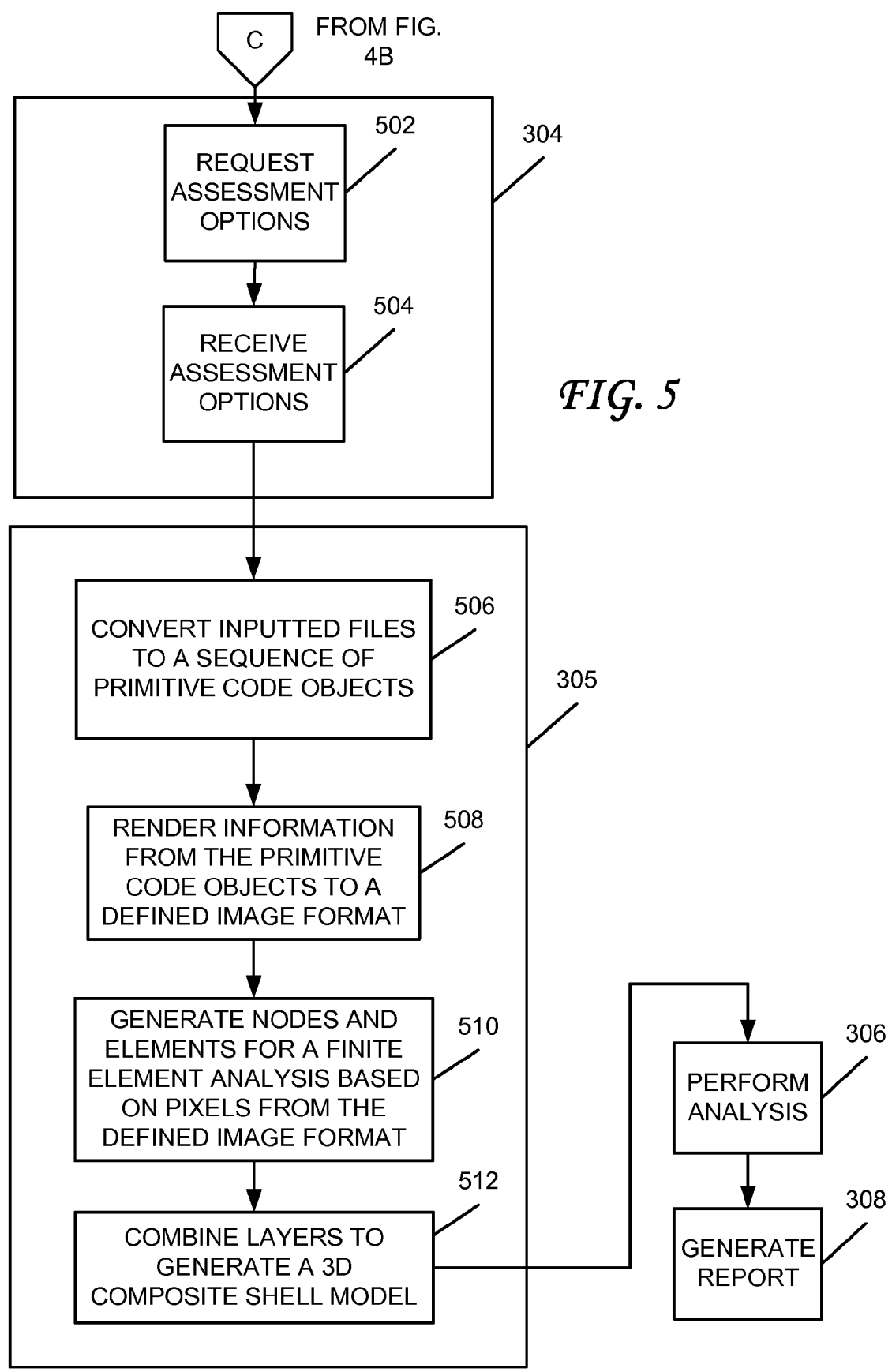

FIG. 5 illustrates exemplary processing of acts 304 and 305 detail. According to the exemplary process, processing system 100 may cause a display screen to be presented to the user via a display of processing system 100 or processing system 204. The display screen may include assessment options which the user may select (act 502). The assessment options may include, for example, an electrical circuit assessment option, a thermal assessment option, a vibration assessment option, a time-to-failure for interconnects assessment option, a time-to-failure for parts assessment option, a component stress analysis assessment option, a design rules for reliability (DfR) and design for manufacturability (DfM) assessment option, or other assessment options. The user may select one or more of the assessment options by using a pointing device, such as a computer mouse, or other input device, such as, for example, a stylus, an electronic pen, a microphone, a keyboard, or even a user's finger on a touch screen display, as well as other input means. Processing system 100 may then receive the user's selected assessment options (act 504) and may then prepare to perform the selected assessments.

With reference again to FIG. 3, processing system 100 may automatically (with no manual intervention) or semi-automatically (with little manual intervention) provide a set of inputs for the selected assessments, based on inputs received during act 302 and at least one database (act 305). For example, in one implementation, processing system 100 may generate finite element analysis models, such as, for example, mechanical and thermal models for a complete electrical assembly. This act is described in more detail below and in FIGS. 5 and 6, with respect to one embodiment.

For example, inputted files may be converted to a sequence of primitive code objects (FIG. 5; act 506). In one implementation, processing system 100 may convert board information in the form of one or more Gerber files into the sequence of primitive code objects. Next, processing system 100 may interpret the primitive code objects through a process of rendering information from the primitive code objects into a defined image format, such as, for example, a bitmap file or other image format file (act 508). Processing system 100 may then use automated meshing algorithms to generate nodes and elements for a finite element analysis based on pixels included in the defined image format file (act 510). When the board information includes information for multiple layers, each layer may be used to determine a composite section lay-up. In this manner, effects of copper and other materials on both mechanical and thermal properties of a printed circuit board can be accounted for. Processing system 100 may then combine the various layers to generate a 3D composite shell model that may be used for conducting mechanical finite element simulations, both modal and static (act 512).

The ability to convert information, such as, for example, Gerber files, directly to a finite element input file greatly reduces the burden on a user when conducting thermal and mechanical simulations.

Next, an analysis of the devices to be assessed may be performed (act 306). The analysis may include the assessment options previously selected by the user. Processing system 100 may analyze the generated finite element analysis models based on provided environmental profiles and may analyze the assembly for design rule violations, such as, for example, component placement or other rule violations.

Figure 6:
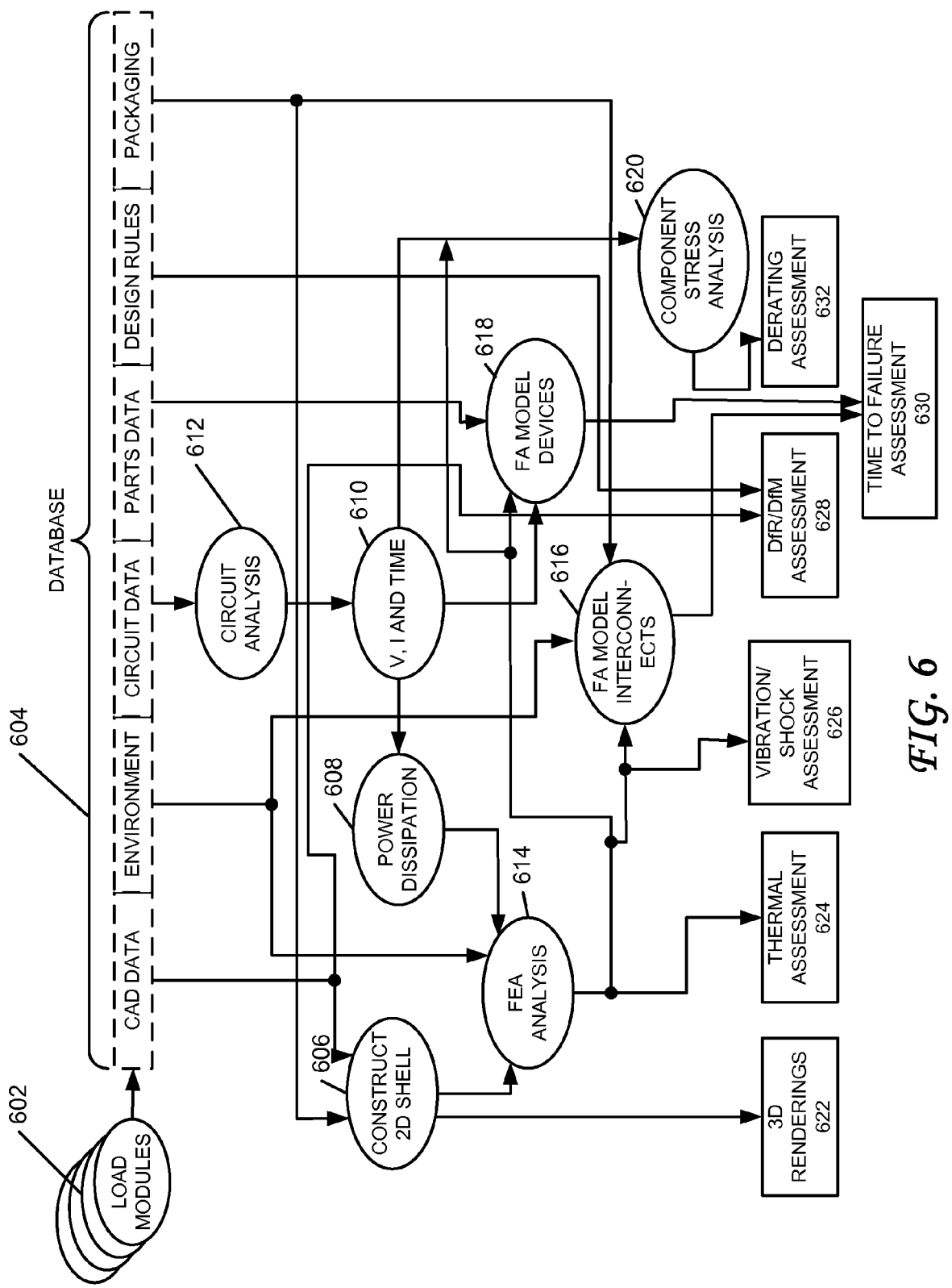
FIG. 6 is an exemplary data flow diagram that illustrates data flow in embodiments consistent with the subject matter of this disclosure.

FIG. 6 illustrates exemplary data flow and processing of act 306 in detail. The process may begin with various load modules or files 602 being input by processing system 100. The modules or files 602 may include Computer Aided Design (CAD) data, BOM data, net list data, XY files and fastener/heat sink data. In other embodiments, additional or different files and/or data may be input. Database 604 may include CAD data, environment data, circuit data, parts data, design rules and packaging data.

A two dimensional shell 606, which may include meshed blocks, may be constructed by processing system 100 from the packaging data and the CAD data of database 604. Processing system 100 may employ the constructed two dimensional shell 606 to produce a three-dimensional rendering 622. Processing system 100 may perform a finite element analysis 614 based on the constructed two dimensional shell 606, environment data of database 604, and results of power dissipation processing 608. Thermal assessment 624 is based on results of finite element analysis processing 614. Circuit analysis processing 612 may use circuit data of database 604 and may produce voltage, current, and duty cycle or time information 610. Voltage, current, and duty cycle or time information 610 may be input by power dissipation processing 608. Further, voltage, current, and duty cycle or time information 610 may be provided for failure model device processing 618 and component stress analysis processing 620. Failure model device processing 618 may use duty cycle information from voltage, current, and time or duty cycle cremation 610, parts data from database 604, and data produced by finite element analysis processing 614 and may provide data for a time to failure assessment 630. Failure model interconnects processing 616 may input environment data from database 604, temperature and component stress information for components from finite element analysis processing 614, and packaging data from database 604. Results of failure model interconnects processing 616 may be provided for time to failure assessment 630. Component stress analysis processing 620 may receive voltage, current, and time or duty cycle information 610 and may produce information for derating assessment 632. Vibration/shock assessment 626 may be produced from finite element analysis processing 614 results. DfR/DfM assessment 628 may be produced from CAD data and design rules from database 604.

Which ones of thermal assessment 624, vibration/shock assessment 626, DfR/DfM assessment 628, time to failure assessment 630, and derating assessment 632 are output may be based on the assessment options received during act 504.

Assessment

In at least some embodiments of processing system 100, a physics-of-failure approach to reliability assessment may be employed. The physics-of-failure approach is based on reliability and time to failure of the product being driven by overstress and wearout mechanisms that may occur when the material strength of the product is exceeded by the applied environmental stress(es). The behavior of these degradation mechanisms can be predicted using equations or algorithms that are derived from the fundamental physics and chemistry that initiate and propagate these behaviors. Other embodiments of the processing device 100 may employ an empirical based approach to reliability assessment. This approach may rely on using field reliability data obtained from similar products to apply a time to failure parameter to each component or part. The value of the time to failure parameter may change based on electrical and environmental loads. Other embodiments of processing device 100 may employ a best practices approach to reliability assessment. The best practices approach is unable to provide a quantitative prediction of behavior, but identifies violations of best practices in design that may result in early failures and product reliability below expectations.

The assessment process can be used for predicting the reliability of a product at a given point in time over a range of use and test conditions. The assessment process may also be used as a business process tool for qualifying designs from internal teams and external suppliers (original design manufacturers) or a reliability assessment tool for identifying and ranking failure sites based on likelihood of occurrence, determining design margins and intrinsic (ideal) durability of the system, conducting design trade-offs, developing qualification tests for the system, and determining acceleration factors or ratios between test and use conditions.

This holistic reliability assessment may identify and quantify sources of reliability risks under anticipated life-cycle loads and may provide customers with an ability to qualify designs in a manner similar to qualifying products through physical testing. This process may rely on an ability of a user to adequately anticipate loads throughout a product lifecycle. Failure models/equations/algorithms derived and documented from test and physical analysis may be used to conduct the failure assessment.

In one embodiment, the reliability assessment may include several tasks:

1. Input of relevant design parameters (geometry, design);
2. Identification of lifecycle loads (thermal, mechanical, electrical, chemical, radiation);
3. Derivation of environmental loads to applied stresses; and
4. Damage evolution and time to failure determination.

Input of design may provide relevant details of a product configuration and layout, including physical dimensions and material properties, to create computer models for a life assessment. Life-cycle loads may define environmental conditions under which a product must operate throughout its life. Levels of life-cycle loads, with associated details, such as, for example, rate of change and duration of exposure, may determine stress magnitudes induced within a product. Derivation of environmental loads to applied stresses may relate a response of the system to environmental and operational loads. Damage evolution and time to failure determination may be conducted by inputting failure models with data from the design capture, the life-cycle loads, and the stress derivation. Output may include an assessment of product life expectancy and a ranking of the potential failure sites and mechanisms under various life-cycle load combinations. A relationship between time-to-failure predictions derived from test and field conditions may be used to define acceleration factors for product failure sites. These acceleration factors may be in turn applied to test results to estimate field life expectancy of the product.

Report Generation

After performing the one or more selected assessments, processing system 100 may generate a report of the assessment results (act 308). In a stand-alone embodiment, the report may be displayed on a display screen of processing system 100. In other embodiments, the report may be transmitted via a network, such as network 202, to a display screen of a user's processing device, such as, for example, processing system 204, for presentation to the user. In other implementations, the report may be transmitted to the user via other means. For example, the report may be sent to one or more pre-configured email addresses, the report may transmitted as a facsimile to one or more pre-configured facsimile phone numbers, or via other means or methods.

In one embodiment consistent with the principles of the subject matter of this disclosure, the report may include a description of the input provided by the user, including types of files provided, such as, for example, BOM, net list, environmental information, or other file types. The report may include text descriptive of one or more components of the analyzed product. For example, the report may include information such as, "The <product name> is a double-sided 14-layer board with surface mount components. The board is approximately 149 mm long and 47 mm wide and contains a number of ceramic and plastic components."

Figure 7:
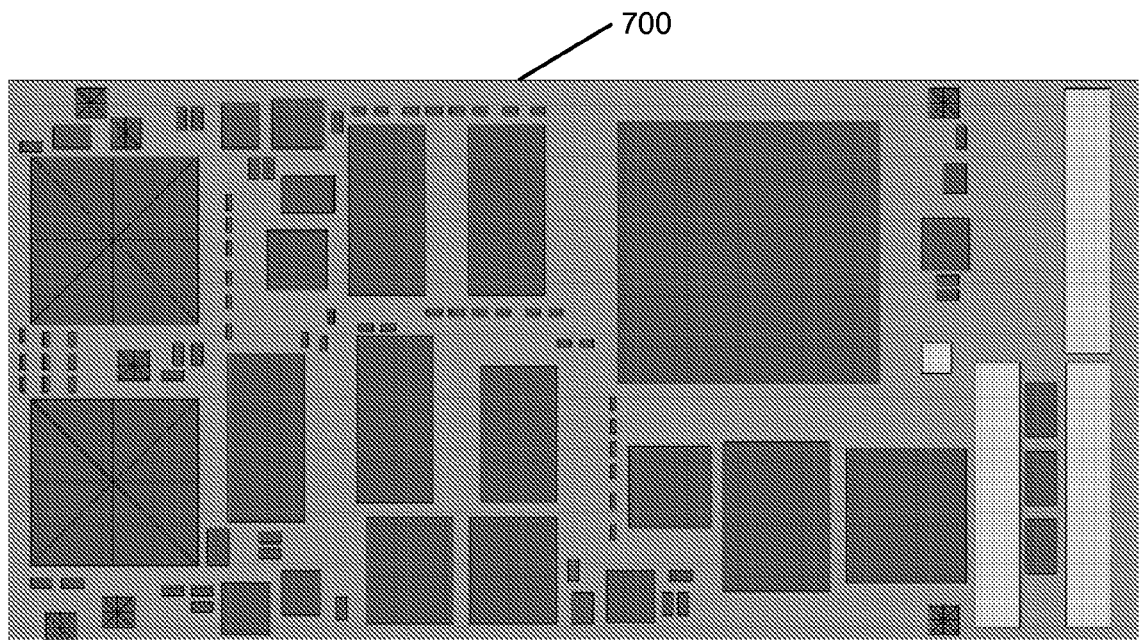
FIGS. 7 and 8 illustrate exemplary figures that may be included in a report generated in embodiments consistent with the subject mater of this disclosure.
Figure 8:
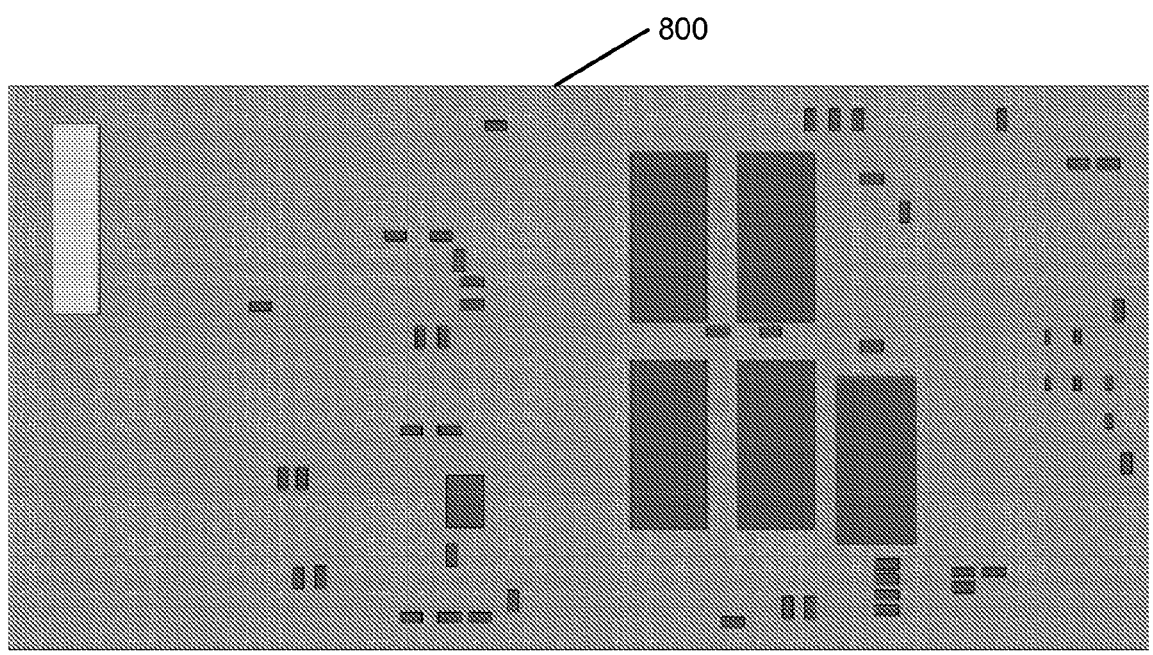

The report may also include figures of models developed from the inputted information. FIG. 7 illustrates an exemplary model 700 of a top-side of a module that may be included in the report. FIG. 8 illustrates a bottom side of exemplary model 800. In FIGS. 7 and 8, an outside polygon, circle, or other shape represents the board outline. In FIGS. 7 and 8, the board outline is represented by an outer rectangle. Various polygons, circles, or other shapes within the board outline may provide a spatial resolution of the components in the bill of materials placed on a top-side of the board. A color range on the component shapes may be used to scale a variety of parameters, including temperature, voltage, current, percent of derating, etc., or identify components of concern. Figures of models may also be three dimensional images.

The report may also include a table including an example of material properties that may be retrieved from a database. Table 1 is an example of such a table.

| Packaging Material | Coefficient of Thermal Expansion (CTE) | Elastic Modulus |
|---|---|---|
| Printed Board (FR-4) | $14 \times 10^{-6}$ xy, $70 \times 10^{-6}$ z | 27.5 GPa |
| Epoxy Molding Compound | $23 \times 10^{-6}$ | 11.7 GPa |
| Alumina (resistors) | $6.8 \times 10^{-6}$ | 350 GPa |
| Barium Titanate (capacitors) | $9.5 \times 10^{-6}$ | 102 GPa |
| BT laminate | $14 \times 10^{-6}$ xy, $50 \times 10^{-6}$ z | 17 GPa |
| Copper | $17.6 \times 10^{-6}$ | 119 GPa |
| Silicon | $3.2 \times 10^{-6}$ | 130 GPa |

Table 1 shows such information as packaging material, coefficient of thermal expansion (CTE) and elastic modulus. Of course, other information may be included in addition to, or instead of the information shown in Table 1. Other tables that may be included in the report include a table that describes worst-case use environments, a table that describes those parts that exceed recommended derating levels, and a figure that identifies various design rule violations.

The report may include a circuit analysis based on an inputted net list and electrical inputs specified by the user. In one embodiment, the circuit analysis may assess component derating and calculate power dissipation for thermal analysis.

The report may further include a thermal analysis to determine temperature rise due to power dissipation. Results of thermal analysis may include color-coded figures, where each color may indicate a particular temperature range.

In addition, the report may include a vibration analysis. In some embodiments, for the vibration analysis, only the largest of the components may be modeled because they have the largest effect on a frequency response of an assembly. Numerous studies have shown that smaller components have a minimal impact on board response.

The report may also include a time-to-failure analysis for interconnections. The thermal results may be used to make fatigue life predictions for various board components. In one implementation, fatigue life may be determined according to:

$$N_f = \frac{1}{2}\left(\frac{\Delta\gamma}{2\varepsilon_f}\right)^{\frac{1}{c}},$$

where $\Delta\gamma$ is a strain range, $\varepsilon_f$ is a fatigue coefficient (for example, 0.325 for ductile metals such as tin-based solders), and c is a fatigue exponent. Calculations for the fatigue exponent may be based on distance to neutral point models similar to those documented in IPC-SM-785, which is a well-known standard that provides guidelines for Accelerated Reliability Testing of Surface Mount Attachments. The robustness of interconnections to vibration may also be characterized according to equations described in, D. S. Steinberg, "Design Guidelines for Random Vibration," Designing Electronic Equipment for Random Vibration Environments, Proc. Institute of Environmental Sciences, 1982, pp 13-16, the contents of which are incorporated by reference herein in its entirety. The report may also include figures showing a power spectral density (PSD) profile used for random response analysis and a board deflection response to the PSD profile.

The report may also include time-to-failure of parts based upon the thermal analysis results, circuit analysis results and data obtained from parts data of database 604. Time to failure predictions may be based upon various degradation models/equations/algorithms. In one implementation, time to failure may be determined according to $$MTTF = Aj_e^{-n}\exp\left(\frac{E_a}{kT}\right),$$

where A is a constant which depends on a number of factors (grain size, line geometry, current density, etc.), je is a current density, n is a constant which depends on residual stress and current density (estimated to be 2), Ea is the activation energy, k is Boltzman's constant and T is the temperature in Kelvin.

The report may include a reliability assessment which may indicate any areas of concern with respect to the design for manufacturability or design for reliability. The report may include a list of design issues, as well as a description of a potential reliability problem with respect to each of the design issues.

Conclusion

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Although the above description may contain specific details, they should not be construed as limiting the claims in any way. Other configurations of the described embodiments are part of the scope of this disclosure. Further, implementations consistent with the subject matter of this disclosure may have more or fewer acts than as described, or may implement acts in a different order than as shown. Accordingly, the appended claims and their legal equivalents should only define the invention, rather than any specific examples given.

We claim as our invention:

1. A method, implemented on a processing system, for assessing reliability of a product, the method comprising:
   receiving a first set of inputs describing aspects of the product;
   generating at least one finite element analysis model based on the first set of inputs and information in at least one database;
   performing an analysis based on the at least one generated finite element analysis model to assess the reliability of the product; and
   generating a report based on the performed analysis, wherein:
   the generating at least one finite element analysis model further comprises:
      interpreting information from a board layout, included in the first set of inputs, to produce at least one file in a defined image format,
      generating nodes and elements for a finite element analysis based on the at least one file in the defined image format, and
      generating models for performing the finite element analysis based on the generated nodes and elements, and
   the processing system performs the method.

2. The method of claim 1, wherein the received first set of inputs include information about a plurality of components included in the product.

3. The method of claim 1, wherein the at least one generated finite analysis model includes data related to mechanical, electrical, and environmental aspects of the product.

4. The method of claim 1, wherein:
   the received first set of inputs include at least one file having the information from the board layout, a listing of parts, sub-assemblies, raw materials included in the product, location coordinates for a plurality of components with respect to at least one printed circuit board included in the product, and a description of electrical connectivity among the plurality of components.

5. The method of claim 1, wherein the performing of the analysis based on the at least one generated finite element analysis model to assess the reliability of the product further comprises:
   performing at least five assessments selected from a thermal assessment, a vibration assessment, a time to failure for interconnects assessment, a time to failure for parts assessment, a DfR/DfM assessment, and a derating assessment.

6. The method of claim 1, further comprising:
mapping a plurality of portions of respective part numbers to data included in the at least one database to provide additional data related to components of the product.

7. The method of claim 6, wherein the at least one database includes at least four databases selected from a material database, a package database, an electrical database, a thermal database, and a failure model database.

8. A tangible machine-readable medium including instructions, encoded therein, for execution by at least one processor of a processing system, the execution of the instructions by the at least one processor causing the processing system to perform a method comprising:
automatically, or semi-automatically, generating at least one finite element analysis model for a plurality of assessments, included in an analysis, based on a first set of inputs and information in at least one database;
performing the analysis based on the at least one generated finite element analysis model to assess reliability of a product; and
generating a report based on the performed analysis, wherein:
the automatically, or semi-automatically, generating at least one finite element analysis model for a plurality of assessments further comprises:
interpreting information from a board layout, included in the first set of inputs, to produce at least one file in a defined image format,
generating nodes and elements for a finite element analysis based on the at least one file in the defined image format, and
generating models for performing the finite element analysis based on the generated nodes and elements.

9. The tangible machine-readable medium of claim 8, wherein the first set of inputs include data pertaining to a bill of materials, location coordinates for a plurality of components with respect to at least one printed circuit board included in the product, and a net list.

10. The tangible machine-readable medium of claim 8, wherein the automatic, or semi-automatic, generating of the at least one finite element analysis model for the plurality of assessments, included in the analysis, based on the first set of inputs and the information in the at least one database further comprise:
performing at least five assessments selected from a thermal assessment, a vibration assessment, a time to failure for interconnects assessment, a time to failure for parts assessment, a DfR/DfM assessment, and a derating assessment.

11. The tangible machine-readable medium of claim 8, wherein the method further comprises:
mapping a plurality of portions of respective part numbers to data included in the at least one database to provide additional data related to components of the product.

12. The tangible machine-readable medium of claim 11, wherein the at least one database includes at least four databases selected from a material database, a package database, an electrical database, a thermal database, and a failure model database.

13. The tangible machine-readable medium of claim 8, wherein the performing of the analysis based on the at least one generated finite element analysis model to assess reliability of a product further comprises analyzing at least some of the first set of inputs against CAD data in a database.

14. A system for assessing reliability of a product, the system comprising:
at least one processor;
a memory;
a storage device including at least one database;
at least one communication interface connecting the at least one processor, the memory, and the storage device, wherein the system is configured to perform:
automatically generating at least one finite element analysis model for a plurality of assessments, included in an analysis, based on a first set of inputs and information in the at least one database;
performing the analysis to assess the reliability of the product; and
generating a report based on the performed analysis wherein:
the automatically generating of the at least one finite element analysis model for a plurality of assessments further comprises:
interpreting information from a board layout, included in the first set of inputs, to produce at least one file in a defined image format,
generating nodes and elements for a finite element analysis based on the at least one file in the defined image format, and
generating models for performing the finite element analysis based on the generated nodes and elements.

15. The system of claim 14, wherein the first set of inputs include at least one file having a board layout, a listing of parts, sub-assemblies, raw materials included in the product, location coordinates for a plurality of components with respect to at least one printed circuit board included in the product, and a description of electrical connectivity among the plurality of components.

16. The system of claim 14, wherein the performing of the analysis to assess the reliability of the product comprises:
performing at least five assessments selected from a thermal assessment, a vibration assessment, a time to failure for interconnects assessment, a time to failure for parts assessment, a DfR/DfM assessment, and a derating assessment.

17. The system of claim 14, wherein the system is further configured to perform:
mapping a plurality of portions of respective part numbers to data included in the at least one database to provide additional data related to components of the product.

18. The system of claim 17, wherein the at least one database includes at least four databases selected from a material database, a package database, an electrical database, a thermal database, and a failure model database.

* * * * *

UNITED STATES PATENT AND TRADEMARK OFFICE
CERTIFICATE OF CORRECTION

PATENT NO. : 7,689,945 B2
APPLICATION NO. : 11/531399
DATED : March 30, 2010
INVENTOR(S) : Craig Damon Hillman and Nathan John Blattau It is certified that error appears in the above-identified patent and that said Letters Patent is hereby corrected as shown below:

Title page, item (73), change the name of Assignee from "D&R Solutions, LLC" to --DfR Solutions, LLC--

Signed and Sealed this

Eleventh Day of May, 2010

David J. Kappos
*Director of the United States Patent and Trademark Office*